United States Patent
Ikeda et al.

(10) Patent No.: US 7,115,878 B2
(45) Date of Patent: Oct. 3, 2006

(54) FLAT PANEL X-RAY DETECTOR

(75) Inventors: Mitsushi Ikeda, Yokohama (JP);
Toshiyuki Oka, Yokohama (JP);
Mutsuki Yamazaki, Yokohama (JP);
Masaki Atsuta, Yokosuka (JP); Akira Kinno, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 210 days.

(21) Appl. No.: 10/728,901

(22) Filed: Dec. 8, 2003

(65) Prior Publication Data

US 2004/0113087 A1 Jun. 17, 2004

(30) Foreign Application Priority Data

Dec. 9, 2002 (JP) .............. 2002-357121

(51) Int. Cl.
*G01T 1/24* (2006.01)

(52) U.S. Cl. ................................ 250/370.09

(58) Field of Classification Search ........... 250/370.09, 250/338.1, 336 R, 340
See application file for complete search history.

(56) References Cited

U.S. PATENT DOCUMENTS

| | | | |
|---|---|---|---|
| 4,689,487 A | | 8/1987 | Nishiki et al. |
| 6,403,965 B1 * | | 6/2002 | Ikeda et al. ............ 250/370.09 |
| 6,507,026 B1 * | | 1/2003 | Sugawara et al. ....... 250/370.09 |
| 6,864,484 B1 * | | 3/2005 | Zur ........................ 250/370.09 |
| 6,933,503 B1 * | | 8/2005 | Sipila et al. ............ 250/370.09 |
| 2001/0008271 A1 * | | 7/2001 | Ikeda et al. ............ 250/370.09 |
| 2001/0010361 A1 | | 8/2001 | Izumi et al. |
| 2005/0082491 A1 * | | 4/2005 | Seppi et al. ............ 250/370.11 |

FOREIGN PATENT DOCUMENTS

| | | |
|---|---|---|
| EP | 1 043 777 A2 | 10/2000 |
| EP | 1 120 833 A2 | 8/2001 |

OTHER PUBLICATIONS

MatWeb, The online Materials database, Automation Creations, Copyright 1996-2006, www.matweb.com.*
Callister, William D., Materials Science and Engineering, 1997, John Wiley and Sons, Inc., Fourth Edition, p. 38.*
http://www.ratio.co.jp/english/education/cd_crystal/ecd_crystal_06.html, Ratio International Corporation Table of elements.*
Street, R. A. et al., "X-Ray Imaging Using Lead Iodide As A Semiconductor Detector", SPIE, vol. 3659, pp. 36-47, (1999).

* cited by examiner

*Primary Examiner*—David Porta
*Assistant Examiner*—Christine Sung
(74) *Attorney, Agent, or Firm*—Finnegan, Henderson, Farabow, Garrett & Dunner, L.L.P.

(57) ABSTRACT

A flat panel X-ray detector which includes an X-ray-charge conversion film converting incident X-rays into electric charges, and a pair of electrodes disposed in contact with both surfaces of the X-ray-charge conversion film The X-ray-charge conversion film has a laminate structure including a plurality of metal halide films differing in band gap from one another and laminated along direction of c-axis of hexagonal crystal structure, and halogen atoms contained in the plurality of metal halide films are of the same kind among them.

20 Claims, 6 Drawing Sheets

BiI3 crystal structure

PbI2 crystal structure

FLAT PANEL X-RAY DETECTOR

CROSS-REFERENCE TO RELATED APPLICATIONS

This application is based upon and claims the benefit of priority from the prior Japanese Patent Application No. 2002-357121, filed Dec. 9, 2002, the entire contents of which are incorporated herein by reference.

BACKGROUND OF THE INVENTION

1. Field of the Invention

This invention relates to a flat panel X-ray detector which is adapted to be used in a medical X-ray diagnostic device.

2. Description of the Related Art

In recent years, there is an increasing trend in the medical field to store the medical data of patients in the form of data base. The reason for this trend is due to the facts that since patients often desire to utilize a plurality of medical facilities for the medical treatment of the same disease, one of the medical facilities which is going to examine such patients may require to know the data that has been already obtained by other medical facilities, in order to enable the medical facilities to perform more appropriate medical treatments on such patients.

There is also a strong demand to store the image data of X-ray photographing in the form of data base, and therefore, it is desired to digitize the images produced by X-ray photography. In the conventional medical X-ray diagnostic device, X-ray images are taken by making use of a silver film. If it is desired to digitize such X-ray images, an operation of reading the images that have been photographed and developed on the film is required by making use of a scanner and the like, thus necessitating a troublesome and time-consuming operation.

Recently, there has been developed an image intensifier TV (II-TV) system which is capable of directly digitizing the X-ray images by making use of a CCD camera of about 1 inch and a large scale vacuum tube provided with a photoelectric film, accelerating electrodes and a fluorescent film. However, this II-TV system is accompanied with a problem that in the case of diagnosing lungs for example, an optical apparatus for achieving the convergence of light for taking a picture of as large an area as 40 cm×40 cm is required, thereby necessitating a large scale apparatus. Further, because of the distortion of image caused due to the deflection of electron beam resulting from the earth's magnetism, or because of the deterioration of resolution resulting from a series of electronic and optical systems such as a fluorescent film, a CCD, etc., the quality of image is caused to deteriorate.

There is also proposed, as a new system for overcoming the problems accompanied with the aforementioned conventional two systems, an X-ray image pickup apparatus using an amorphous silicone thin film transistor (a-Si TFT) (hereinafter referred to as a flat panel X-ray detector) (for example, U.S. Pat. No. 4,689,487).

According to this flat panel X-ray detector, the pixels thereof are all constituted by the a-Si TFT, a photoelectric conversion film and pixel capacitance, and these pixels are arranged in the form of an array where hundreds or thousands of pixels are aligned along vertical and horizontal lines (hereinafter referred to as TFT array).

In this flat panel X-ray detector, a bias voltage from a power source is applied to the photoelectric conversion film, and the a-Si TFT is connected with a signal line and with a scanning line and controlled to turn ON/OFF by means of a scanning line driving circuit. The terminal of the signal line is connected, via a change-over switch, with a signal-detecting amplifier.

When a beam of light is irradiated to the detector, an electric current is permitted to flow through the photoelectric conversion film so as to enable electric charge to be stored in the pixel capacitance. The scanning line is designed to be driven by means of the scanning line driving circuit, so that when all TFTs connected with a single scanning line are turned ON, the electric charge stored as mentioned above is transmitted, via the signal line, to the amplifier side. In every pixel, electric charge is inputted into the amplifier by making use of the change-over switch and then converted sequentially into a signal so as to enable it to be displayed on a CRT, etc. In this case, depending on the magnitude of the light entering into the pixel, the magnitude of electric charge is caused to change, thereby causing the output amplitude of the amplifier to change.

According to this system, X-ray images can be directly turned into digital images by A/D-converting the output signals of the amplifier. Further, since the pixel region thereof is formed of the same structure as that of a thin film transistor liquid crystal display (TFT-LCD) which is commonly employed in a note-type personal computer, a display which is thin and large in picture plane can be easily manufactured.

These conventional systems explained above are all related to a flat panel X-ray detector of indirect conversion system wherein the incident X-ray is converted by means of a fluorescent substance, etc. into visible light, which is then converted into electric charge by means of the photoelectric conversion film of each of the pixels.

Apart from these conventional systems, there is also known a flat panel X-ray detector of direct conversion system wherein the X-ray entering into the pixels is directly converted into electric charge. This flat panel X-ray detector conversion system differs from that of indirect conversion system in the respect that an X-ray is directly converted by means of the photoelectric conversion film into electric charge, which is then stored in the pixel capacitance. Namely, this flat panel X-ray detector of direct conversion system is almost identical in structure with the flat panel X-ray detector of indirect conversion system except that the fluorescent substance is not provided therewith.

This flat panel X-ray detector of direct conversion system is constructed such that a capacitor (Cst) consisting of a laminate structure comprising a capacitor electrode, an insulating layer and an auxiliary electrode, a switching TFT connected with the capacitor, and a protective TFT are disposed on the surface of a glass substrate. Each of these components is covered with a protecting film having a contact hole disposed over the auxiliary electrode. On this protecting film, there are successively superimposed a pixel electrode (which is connected via the contact hole with the auxiliary electrode), an X-ray-charge conversion film, and a common electrode (upper electrode). The pixels constructed as described above are arranged in a form of array.

When X-ray is irradiated to the detector, the X-ray is converted by means of the X-ray-charge conversion film into electric charge which is then accelerated by an electric field applied between the common electrode and the pixel electrode and stored in the capacitor. The switching TFT is driven through the scanning line so as to transfer the electric charge that has been stored in the capacitor to the signal line.

The function of the protective TFT is to release electric charge whenever an excessive electric charge happens to be generated.

It is required that the signal charge generated from the X-ray is enabled to immediately reach the pixel electrode and stored in the pixel capacitance. If the signal charge is permitted to remain inside the X-ray-charge conversion film, it would lead to the generation of defective images such as residual images where the previous image patterns are left behind or the deterioration of resolution. Most of these defective images are caused to generate due to the signal charge that has been left remained in the X-ray-charge conversion film and acts to badly affect the traveling of the signal charge that has been newly generated by the X-ray. Further, there is another problem that when the X-ray-charge conversion film is accompanied with a large number of defects, electric current passing through such defects is generated, thereby increasing the dark current.

It is conventionally known to construct the X-ray-charge conversion film by making use of $PbI_2$ which is excellent in properties and is expected to be very useful as a material for forming the X-ray-charge conversion film. As a matter of fact however, since this $PbI_2$ is poor in crystallinity especially when it is formed into a thin film, the employment of this $PbI_2$ is also accompanied with the same problems as mentioned above, i.e. residual images, the deterioration of resolution, the generation in considerable degree of dark current, etc. Therefore, up to date, no one has succeeded to manufacture the X-ray-charge conversion film which is excellent in properties (see R. A. Street et al., SPIE Vol. 3659, P. 36,1999).

It is imperative to improve the quality of the X-ray-charge conversion film in order to overcome the generation of aforementioned defective images. According to the prior art however, since a polycrystalline X-ray-charge conversion film which is not so good in quality is deposited on the surface of the underlying substrate in general, a large number of grain boundaries and traps are caused to exist in the film near the interface between the film and the substrate, thereby making it impossible to avoid the generation of residual images and the deterioration of the resolution of images. Furthermore, since a large magnitude of dark current is generated in the case of such a defective film as mentioned above, it is very difficult to perform the detection of images under a faint X-ray dose.

As explained above, as long as the conventional photosensitive films are to be employed for the manufacture of the flat panel X-ray detector, it has been very difficult to form the X-ray-charge conversion film which is excellent in quality. Therefore, it has been very difficult to overcome the generation of residual images, as the deterioration of the resolution of images, and especially the generation of large dark current.

BRIEF SUMMARY OF THE INVENTION

An object of the present invention is to provide a flat panel X-ray detector which is capable of improving image defects such as the generation of residual images and the deterioration of resolution of images, and capable of overcoming the difficulties of detecting images by making use of faint X-ray that may be attributed to an increased generation of dark current.

According to an aspect of the present invention, there is provided a flat panel X-ray detector which comprises: an X-ray-charge conversion film converting incident X-rays into electric charges; and a pair of electrodes disposed in contact with both surfaces of the X-ray-charge conversion film; wherein the X-ray-charge conversion film has a laminate structure including a plurality of metal halide films laminated along direction of c-axis of hexagonal crystal structure and differing in band gap from one another, and halogen atoms contained in the plurality of metal halide films are of the same kind among them.

According to another aspect of the present invention, there is provided a flat panel X-ray detector which comprises: an X-ray-charge conversion film converting incident X-rays into electric charge; pixel electrodes formed on the X-ray-charge conversion film to correspond with each of pixels which are arranged in a form of array; switching elements each electrically connected with each of the pixel electrodes;

signal lines each electrically connected with the switching element of each row; scanning lines each electrically connected with the switching element of each column; and a common electrode which is disposed on one of the surfaces of the X-ray-charge conversion film, which is opposite to the surface where the pixel electrodes of the X-ray-charge conversion film are disposed; wherein the X-ray-charge conversion film has a laminate structure comprising a plurality of metal halide films laminated along a direction of c-axis of hexagonal crystal structure and differing in band gap from one another, the halogen atoms of the metal halide films are of the same kind with one another.

DETAILED DESCRIPTION OF THE INVENTION

Following are explanation of the flat panel X-ray detector according to one embodiment of the present invention.

In this flat panel X-ray detector according to one embodiment of the present invention, the X-ray-charge conversion film is formed of a laminate structure comprising a plurality of metal halide films differing in band gap from one another and laminated along the direction of c-axis of hexagonal crystal structure, the halogen atoms in the metal halide films are of the same kind with one another.

The reason for employing metal halides as an X-ray sensitive material forming the X-ray-charge conversion film resides in the fact that metal halides are excellent in X-ray-charge conversion efficiency. As for specific examples of metal halides, it is preferable to select those having a high X-ray absorption coefficient in order to realize high absorption efficiency of X-ray.

As for the metal of the metal halides, it is preferable to select from Pb, Hg, Tl, Bi, Cd, In, Sn and Sb, because they have high X-ray absorption coefficient. Among them, Pb, Hg, and Bi, all having very high X-ray absorption coefficient, are more preferable. In view of minimizing the environmental influence of the metal halides, however, it is more preferable not to employ Hg and Pb both giving an influence on environmental safety, but is preferable to select from In, Bi and Sn.

As for the halogen of the metal halides, it is preferable to select from Cl, Br and I. Among them, I which has high absorption coefficient is most preferable.

Figure 9A:
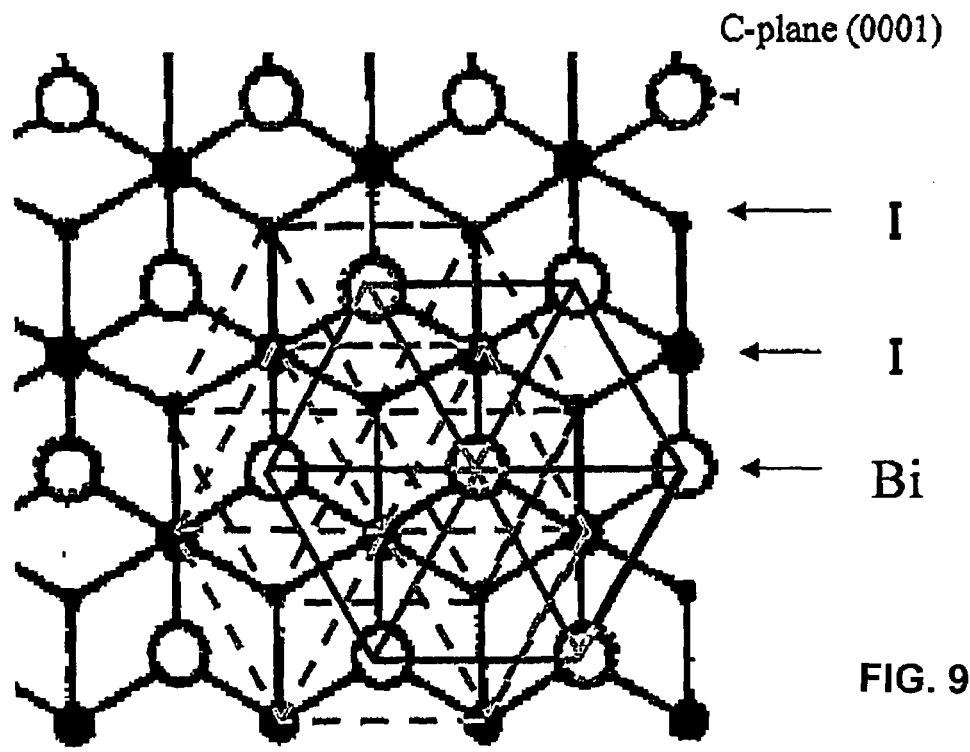
FIGS. 9A and 9B are diagrams illustrating a general hexagonal structure, in the c-plane, for $BiI_3$.
Figure 9B:
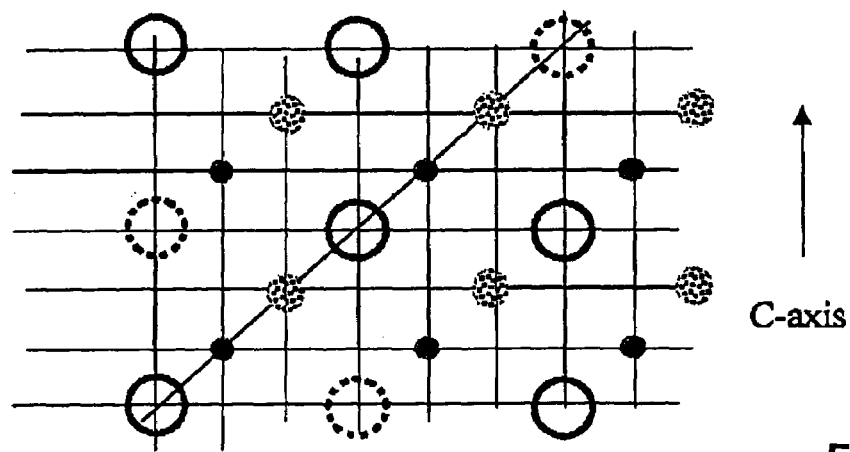
Figure 10A:
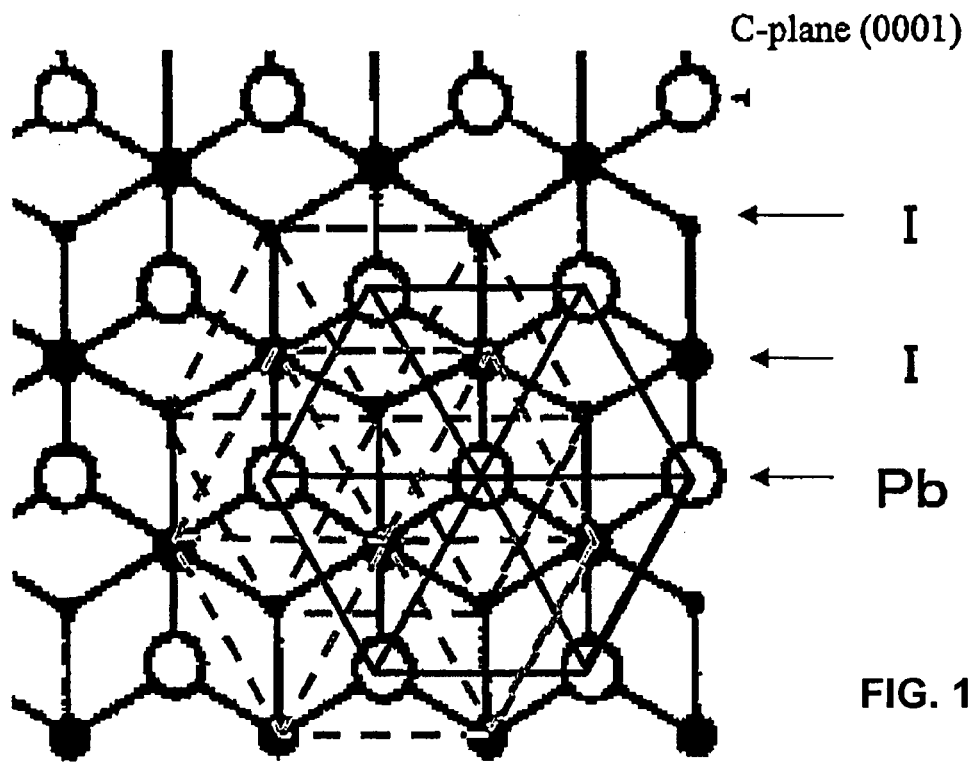
FIGS. 10A and 10B are diagrams illustrating a general hexagonal structure, in the c-plane, for $PbI_2$.
Figure 10B:
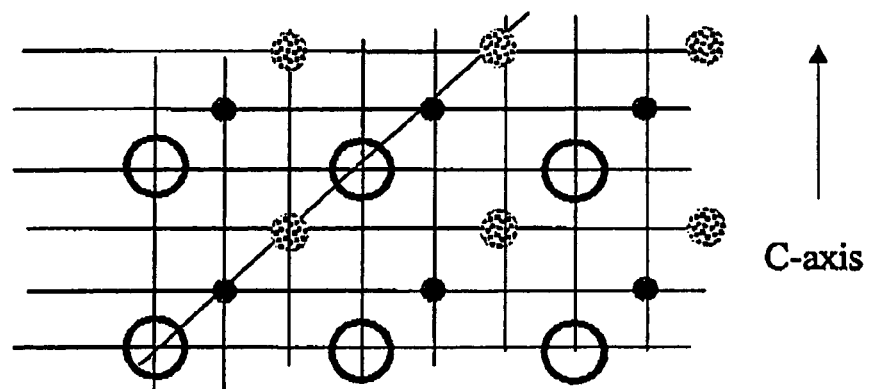

More specifically, the employment of $BiI_3$ and $SnI_2$ as a metal halide is more preferable than $PbI_2$ and $CdI_2$. These materials are basically of hexagonal crystal structure, and the lattice constants are nearly the same between these halides with the same halide and different metals. For example. FIG. 9A illustrates a general hexagonal structure, in the c-plane, for $BiI_3$, FIG. 9B illustrates a different view of the $BiI_3$ structure shown in FIG. 9A, this time showing the direction of the c-axis. Similarly, FIG. 10A illustrates a general hexagonal structure, in the c-plane, for $PbI_2$. FIG. 10B illustrates a different view of the $PbI_2$ structure shown in FIG. 10A, this time showing the direction of the c-axis. Since the specific resistance in the direction of the c-axis of hexagonal crystal structure is relatively high, when the X-ray-charge conversion film is constructed by making use of these materials of hexagonal crystal structure in the C-axis direction, it is now possible to suppress the generation of dark current at the interface between different kind of metal halide, thereby making it possible to detect faint signals and hence to improve the performance of the X-ray detector.

Although part of Bi atoms of the hexagonal structure of $BiI_3$, $BiBr_3$, $BiCl_3$, etc. is missing, even if the hexagonal structure is partially deficient in this manner, the effects to be derived from the lattice matching would be almost the same as those where the hexagonal structure is non-deficient. Therefore, by depositing these metal halide films to form a multi-layer metal halide films, on the surface of different metal but the same halogen, it is possible to form an X-ray-charge conversion film excellent in quality.

Also a similar effect can be realized between a metal halide film and a substrate with basically hexagonal structure. These materials are basically of hexagonal crystal structure as exemplified by $SnI_2$ shown in FIG. 5, and the lattice constant thereof is close to the lattice constant of the underlying substrate. Since the specific resistance in the direction of c-axis of hexagonal crystal structure is relatively high, when the X-ray-charge conversion film is constructed by making use of these materials of hexagonal crystal structure, it is now possible to suppress the generation of dark current at the interface between a metal halide and a hexagonal like substrate, thereby making it possible to detect faint signals and hence to improve the performance of the X-ray detector.

Specific examples of the embodiments of the present invention of the X-ray-charge conversion film that can be preferably employed for fabricating the flat panel X-ray detector will be explained as follows.

1. A laminate structure formed of metal halides which are the same in kind with one another but differ in conductivity type from one another:

Specific example of this laminate structure includes a laminate consisting of an n-type metal halide film and a p-type metal halide film, such as a laminate of a Bi-doped n-type $PbI_2$ film and an In-doped p-type $PbI_2$ film.

Alternatively, example of this laminate structure also includes a laminate consisting of an n-type metal halide film, an i-type metal halide film and a p-type metal halide film, such as a laminate consisting of a Bi-doped n-type $PbI_2$ film, an undoped $PbI_2$ film and an In-doped p-type $PbI_2$ film.

2. A laminate structure formed of mixed crystalline metal halides consisting of the same kinds of metal halides but additionally including different kinds of metal elements therein:

Specific example of this laminate structure includes a laminate consisting of a $Pb_xB_yI$ film, a $PbI_2$ film and a $Pb_xIn_yI$ film.

3. A laminate structure formed of various kinds of metal halides:

A specific example of this laminate structure includes a laminate consisting of a $BiI_3$ film and a $PbI_2$ film.

Since every films of the aforementioned laminate structure are all formed of a hexagonal crystal structure and all of the halogens included in each film of the laminate structure are the same in kind, the lattice constant of the films of the laminate structure is approximately the same with one another and hence all of the films are laminated along the direction of c-axis. Incidentally, this laminating direction may not necessarily be completely the same as that of c-axis but may be more or less deviated from the direction of c-axis, e.g. by an angle between +5° and −5°.

As for the thickness of the X-ray-charge conversion film formed of a laminate film, it may be optionally selected as long as it is capable of sufficiently absorbing X-ray. In particular, the thickness of a high resistance semiconductor film may be optionally selected as long as a photo-carrier (electron or hole) is enabled to travel through the high resistance film within a time of about 1/10 of the address time.

In the flat panel X-ray detector according to one embodiment of the present invention, it is preferable that at least one of a pair of electrodes is formed of a conductive film which can be aligned in lattice matching with metal halide films disposed neighboring thereon.

As for the underlying substrate for the metal halide film, it may be a bulk form or a thin film. As for the materials for the substrate, any conducting film can be used such as metal, ITO, $SnO_2$ and so on. It is preferable to employ a material whose lattice constant of equivalent hexagonal crystal structure is close to that of the metal halide.

In the case where halogen of the metal halide is I, it is preferable to employ a material formed of a hexagonal crystal structure having a-axis lattice constant of 4.5 angstroms, a face-centered cubic structure having a-axis lattice constant of 6.45 angstroms or a body-centered cubic structure having a-axis lattice constant of 3.97 angstroms, as for the materials for the substrate.

In the case where halogen of the metal halide is Br, it is preferable to employ a material formed of a hexagonal crystal structure, a face-centered cubic structure or a body-centered cubic structure having a-axis lattice constant of 3.88 angstroms, 5.49 angstroms or 3.38 angstroms, respectively. In the case where halogen of the metal halide is Cl, it is preferable to employ a material formed of a hexagonal crystal structure, a face-centered cubic structure or a body-centered cubic structure having a-axis lattice constant of 3.44 angstroms, 4.86 angstroms or 2.99 angstroms, respectively.

As for the materials for the substrate, it is preferable to employ a material having a lattice constant which is close to the lattice constant of the ab crystal face of hexagonal crystal structure of the metal halide. Examples of suitable materials for the substrate where the halogen of the metal halide is iodine are shown below together with the lattice constants thereof (numerals in the parenthesis are based on angstrom). Of course, the materials for the substrate are not confined to the following materials but may be selected from other kinds of materials as long as the lattice constant thereof is close to that of the metal halides.

The aforementioned example of suitable materials for the substrate includes Se(4.36), Te(4.46), HgS(4.15), CdS (4.14), AgI(4.60), Ca(3.98), $B_2O_3$(4.325), $RbC_8$(4.98), $CO_2N$(4.6), $Cr_2N$(4.75), $CoTa_2N_2$(5.16), $FeTa_2N_2$(5.16), TaN(5.19) and $V_2N$(4.91).

Figure 5:
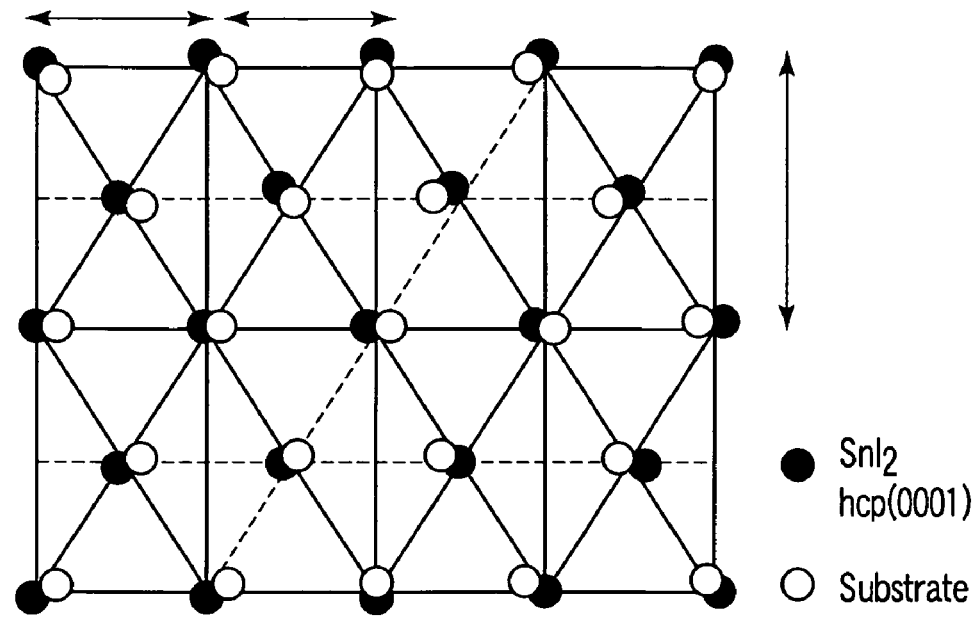
FIG. 5 is a diagram illustrating a state where an $SnI_2$ is lattice-matched with an underlying substrate.

Next, preferable examples of the material for the substrate where the substrate is formed of a face-centered cubic structure are shown below together with the lattice constants thereof (angstroms). As shown in FIG. 5, the (111) plane of the face-centered cubic structure is lattice-matched with the metal halide of hexagonal crystal structure. Namely, such preferable examples of materials include Ni(3.52), Ge(5.65), αSn(6.486), CdSe(6.05), InSb(6.478), AlSb(6.1355), GaSb (6.0955), PbTe(6.46), AgBr(5.77), CdTe(6.48), HgTe(6.46), PbS(5.936) and AgI(6.496).

Preferable examples of the material for the substrate where the substrate is formed of a body-centered cubic structure are shown below together with the lattice constants thereof (angstroms). As shown in FIG. 5, the (110) plane of the body-centered cubic structure is lattice-matched with the metal halide of hexagonal crystal structure. Namely, such preferable examples of materials include γCa(4.477), Eu(4.606), γSr(4.84), βTh(4.11), βTl(3.874), $SnO_2$(4.21), TiN(4.24), ZrN(4.577), HfN(4.526), VN(4.14), CrN(4.149) and TaN(4.38). In the case of rhombohedron also, the materials should preferably have the similar lattice constant as that of hexagonal crystal structure.

Since halogen is highly reactive, the underlying substrate should preferably be selected from materials which are excellent in chemical resistance. Among the aforementioned materials, preferable examples in terms of chemical resistance include, in the case of hexagonal crystal structure, CdS(4.14), $B_2O_3$(4.325), $RbC_8$(4.98), $CO_2N$(4.6), $Cr_2N$ (4.75), $CoTa_2N_2$(5.16), $FeTa_2N_2$(5.16), TaN(5.19) and $V_2N$ (4.91).

Preferable examples in terms of acid resistance include, in the case of face-centered cubic structure, Ge(5.65), CdSe (6.05), InSb(6.478), AlSb(6.1355), GaSb(6.0955), PbTe (6.46), CdTe(6.48), HgTe(6.46) and PbS(5.936).

Preferable examples in terms of chemical resistance include, in the case of body-centered cubic structure, $SnO_2$ (4.21), TiN(4.24), ZrN(4.577), HfN(4.526), VN(4.14), CrN (4.149) and TaN(4.38).

As for the method of forming a film for the underlying substrate, any kind of method such as a sputtering method, a vapor deposition method, an ion plating method, etc. can be employed. In particular, by means of bias voltage, it becomes possible to control the crystal structure as well as the crystal orientation of the film.

As long as the misalignment of lattice between the underlying substrate and the metal halide can be confined within 10% (between −10% and +10%), it would be possible to form a metal halide film which is excellent in crystallinity on the surface of the underlying substrate. If this misalignment of lattice can be confined to not more than 20%, it is possible to control the crystalline structure as well as the orientation of the metal halide. However, when this misalignment of lattice is increased more than 20%, the orientations of metal halide films would be confused with one another, thereby making it difficult to control the crystalline structure and orientation of the metal halide. Therefore, it would be preferable to confine this misalignment to not higher than 20%. Incidentally, the misalignment of lattice will be represented by a difference in ratio to be obtained by dividing the lattice constant of the metal halide film by the lattice constant of the underlying metal.

The present invention will be further explained with reference to various examples as follows.

First Embodiment

Figure 1:
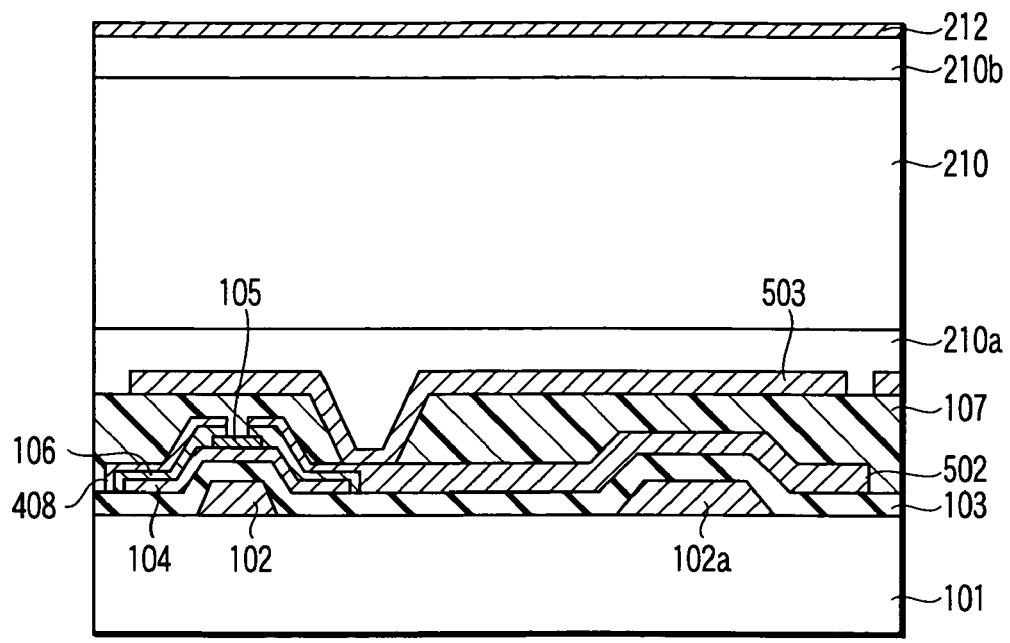
FIG. 1 is a cross-sectional view of the flat panel X-ray detector according to a first embodiment of the present invention.

Following are explanations of the first embodiment of the present invention. The cross-sectional view of the pixel of the flat panel X-ray detector according to this embodiment is shown in FIG. 1. Next, the manufacturing steps of the flat panel X-ray detector according to this embodiment will be explained with reference to FIG. 1.

First of all, either a single layer of film formed of MoTa, Ta, TaN, Al, Al alloy or MoW, or a double layer consisting of Ta and TaNx is deposited to a thickness of about 300 nm on the surface of a glass substrate 101, and the deposited layer is patterned by means of etching to form a gate electrode 102 of a switching TFT 402, a scanning line (not shown), an electrode 102*a* of a storage capacitance 404, and a storage capacitance line (not shown).

Then, by means of plasma CVD, SiOx is deposited to a thickness of about 300 nm and SiNx is deposited to a thickness of about 50 nm, thereby forming a laminated insulating film 103. Thereafter, an undoped a-Si layer 104 having a thickness of about 100 nm and a stopper 105 consisting of SiNx and having a thickness of about 200 nm are successively deposited.

By means of back exposure method, the stopper 105 is patterned in conformity with the gate electrode 102, and then, an $n^+$a-Si layer 106 is deposited thereon to a thickness of about 50 nm. Thereafter, the a-Si layer 104 and the $n^+$a-Si layer 106 are etched to form an island consisting of a-Si in conformity with the configuration of transistor.

Part of the insulating film 103 which corresponds to the contact portions inside of the pixel area and outside of the pixel area is etched away to form contact holes. Then, by means of sputtering, a layer of Mo having a thickness of about 50 nm, a layer of Al having a thickness of about 350 nm and another layer of Mo having a thickness of about 20 nm to 50 nm are laminated thereon to form an auxiliary electrode 502, a signal line 408, the source/drain of TFT, and other wirings.

Thereafter, a layer of SiNx having a thickness of about 200 nm, and a layer of acrylic resin (HRC: trade name, Nippon Gosei Rubber Co., Ltd.) having a thickness of about 1 to 5 μm, preferably about 3.5 μm are deposited to form a protective film 107. In this case, BCB may be employed in place of the HRC.

After a contact hole to the auxiliary electrode 502 is formed in the protective film 107, an ITO film is formed as a metal for the pixel electrode. This ITO film is formed to a thickness of 1000 angstroms by means of sputtering method using ITO as a target.

Then, by making use of a photoresist, a pixel electrode pattern is formed on this ITO film and employed as a mask to perform the patterning of the ITO film by wet etching. Thereafter, the photoresist is removed to form a pixel electrode 503.

Then, by means of vapor deposition, a p-type $SnI_2$ layer 210a is formed on the pixel electrode 503 to a thickness of 1 to 50 μm, more preferably 10 μm. Thereafter, by means of vapor deposition, a high resistance $SnI_2$ layer 210 is formed on the p-type $SnI_2$ layer 210a to a thickness of about 100 μm to 1000 μm, more preferably 300 μm. Additionally, by means of vapor deposition, an n-type $SnI_2$ layer 210b is formed on the $SnI_2$ layer 210 to a thickness of 1 to 50 μm, more preferably 10 μm at a temperature of 200° C. It is possible, in this manner, to form a laminate of $SnI_2$ layers 210a, 210 and 210b acting as an X-ray-charge conversion film of high quality and of hexagonal crystal structure having an orientation of (001).

A layer of Cr having a thickness of 200 nm is formed, without the accompaniment of patterning step, on the surface of the $SnI_2$ layer 210 to form an upper electrode 212. Incidentally, with respect to the p-type $SnI_2$ layer 210a and the n-type $SnI_2$ layer 210b which are disposed over and below the high resistance $SnI_2$ layer 210, they are not necessarily be disposed concurrently, but one of them may be omitted. Alternatively, the $SnI_2$ layer 210 may be omitted and only the p-type $SnI_2$ layer 210a and the n-type $SnI_2$ layer 210b may be formed instead.

Figure 6:
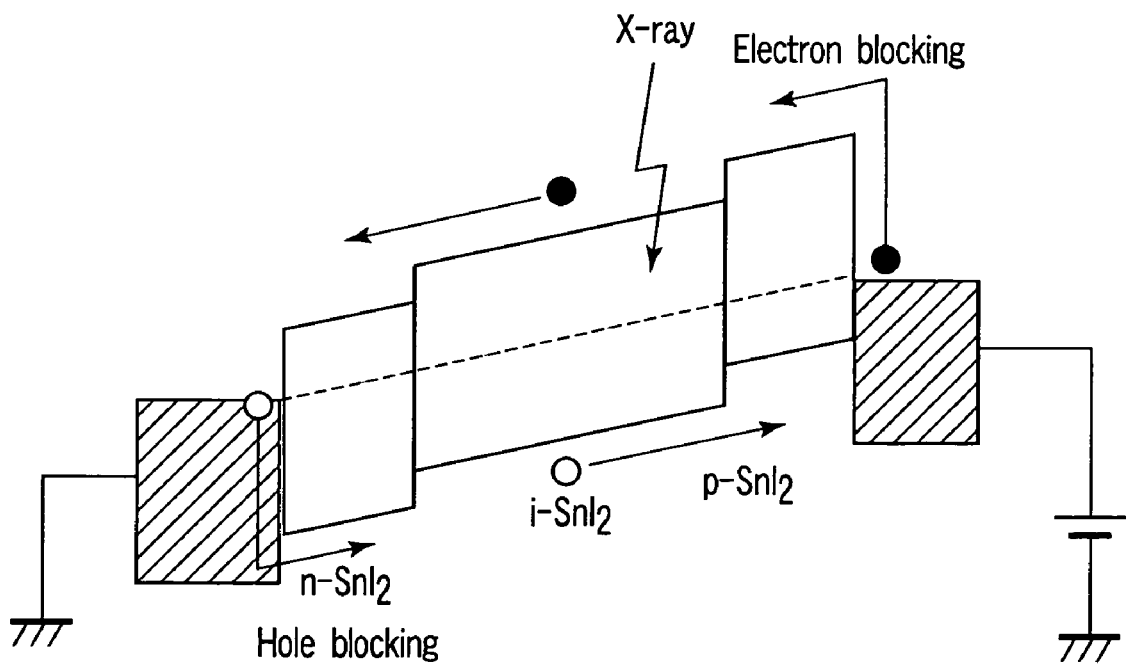
FIG. 6 is a diagram illustrating the band structure of the X-ray-charge conversion film of the flat panel X-ray detector according to a first embodiment of the present invention.

The band structure of a laminate structure of $SnI_2$ layers 210a, 210 and 210b as a X-ray-charge conversion film is shown in FIG. 6.

As seen from the band structure diagram shown in FIG. 6, electrons and holes generated in i-type $SnI_2$ layer due to excitation by X rays arrive at an anode and cathode respectively, without any barrier. On the other hand, the number of electrons and holes injected from the cathode and anode respectively, decrease in compared with the case of no p-layer or n-layer, because of the barriers formed by the p-type $SnI_2$ layer and the n-type $SnI_2$ layer. As those electrons and holes from the electrodes, which get over the barriers, produce dark current, the dark current in the flat panel X-ray detector according to this embodiment is low. That is, the structure of the flat panel X-ray detector according to this embodiment is effective in lowering of the dark current.

Then, peripheral driving circuits are mounted on the substrate of the TFT array X-ray-charge conversion film that has been fabricated as described above to thereby accomplish the manufacture of a flat panel X-ray detector. When the detection of X-ray images was performed by making use of this flat panel X-ray detector, excellent effects were recognized, i.e. it was possible to minimize residual images and to improve the resolution of images as compared with the flat panel X-ray detector which was manufactured by forming, on the pixel electrodes thereof, an X-ray-charge conversion film where the lattice constants of the films are not aligned with one another.

Second Embodiment

Figure 2:
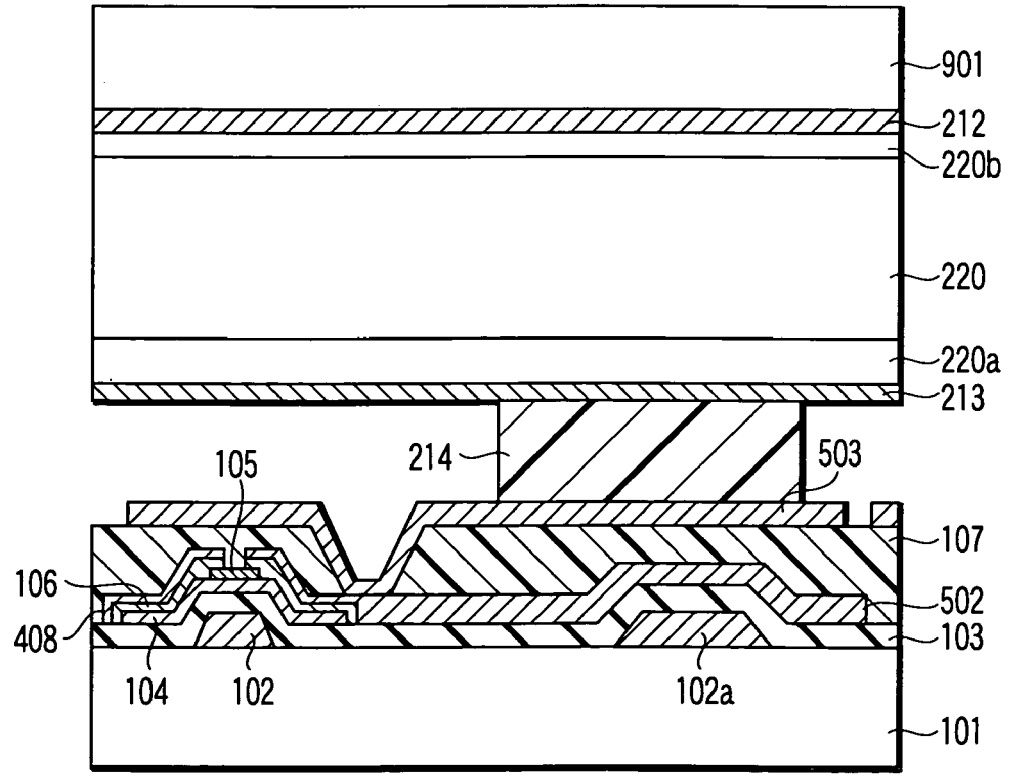
FIG. 2 is a cross-sectional view of the flat panel X-ray detector according to a second embodiment of the present invention.

Following are explanations of the second embodiment of the present invention. The cross-sectional view of the pixel of the flat panel X-ray detector according to this embodiment is shown in FIG. 2. Next, the manufacturing steps of the flat panel X-ray detector according to this embodiment will be explained with reference to FIG. 2.

First of all, an electrode 212 formed of $Zr_2N$ of (110) azimuth of hexagonal crystal structure is deposited to a thickness of 1000 angstroms on the surface of a glass substrate 901. For the purpose of orientating the $Zr_2N$ to the azimuth of (110), an ion plating or sputtering method is employed and a minus bias is applied onto the substrate, thereby making it possible to control the direction of the orientation of the $Zr_2N$.

Then, by means of vapor deposition, a p-type $PbI_2$ layer 220a is formed on the electrode 212 to a thickness of 1 to 50 μm, more preferably 10 μm. Thereafter, by means of vapor deposition, a high resistance $PbI_2$ layer 220 is formed on the p-type $PbI_2$ layer 220a to a thickness of about 100 μm to 1000 μm, more preferably 300 μm. Additionally, by means of vapor deposition, an n-type $PbI_2$ layer 220b is formed on the $PbI_2$ layer 220 to a thickness of 1 to 50 μm, more preferably 10 μm at a temperature of 250° C. It is possible, in this manner, to form a laminate of $PbI_2$ layers 220a, 220 and 220b, which is excellent in quality and of hexagonal crystal structure having an orientation of (001).

Thereafter, a lower electrode 213 is formed on this laminate of $PbI_2$ layers 220a, 220 and 220b. Then, an organic conductive film is coated on this lower electrode 213 and patterned by way of exposure and development in conformity with the pitch of pixels of a TFT array substrate which has been fabricated in the same manner as the above first embodiment, thus forming a connecting electrode column 214.

The substrate manufactured in this manner is connected with the ITO pixel electrode 503 of the TFT array substrate which has been fabricated in the same manner as the above first embodiment to accomplish the array of the X-ray-charge conversion film. Incidentally, with respect to the p-type $PbI_2$ layer 220a and the n-type $PbI_2$ layer 220b which are disposed over and below the high resistance $PbI_2$ layer 220, they are not necessarily be disposed concurrently, but one of them may be omitted. Alternatively, the $PbI_2$ layer 220 may be omitted and only the p-type $PbI_2$ layer 220a and the n-type $PbI_2$ layer 220b may be formed instead.

Then, peripheral driving circuits are mounted on the substrate of the TFT array X-ray sensitive film substrate that has fabricated as described above to thereby accomplish the manufacture of a flat panel X-ray detector. When the detection of X-ray images was performed by making use of this flat panel X-ray detector, excellent effects were recognized, i.e. it was possible to minimize residual image, to improve the resolution of image and to decrease the dark current as compared with the flat panel X-ray detector which was manufactured by forming, on the pixel electrodes thereof, an X-ray-charge conversion film where the lattice constants of the films are not aligned with one another.

Third Embodiment

Figure 3:
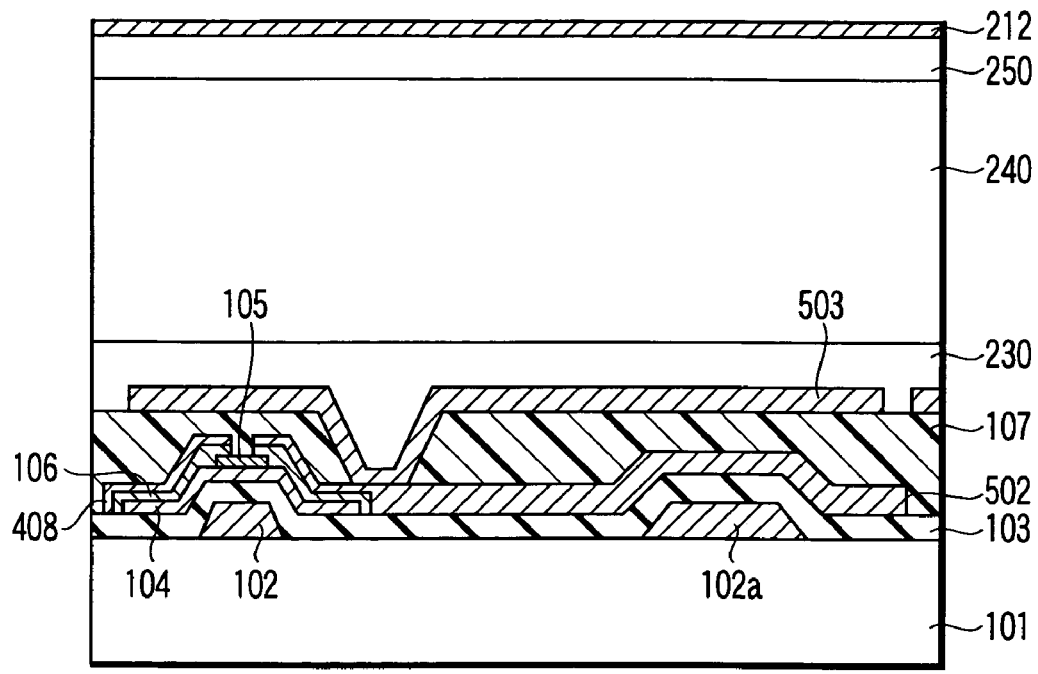
FIG. 3 is a cross-sectional view of the flat panel X-ray detector according to a third embodiment of the present invention.

Following are explanations of the third embodiment of the present invention. The cross-sectional view of the pixel of the flat panel X-ray detector according to this embodiment is shown in FIG. 3. Next, the manufacturing steps of the flat panel X-ray detector according to this embodiment will be explained with reference to FIG. 3.

First of all, a TFT array is fabricated on a glass substrate 101 in the same manner as described in the aforementioned first embodiment. Then, a $V_2N$ film is formed as a metal for the pixel electrode to a thickness of 1000 angstroms by means of sputtering method using $V_2N$ as a target. This $V_2N$ film may be formed by means of sputtering method using a $V_2N$ target in an Ar atmosphere to which $N_2$ is added.

Then, a photoresist pattern is formed on this $V_2N$ film in conformity with the configuration of the pixel electrodes.

Thereafter, by making use of this resist as a mask, the patterning of the $V_2N$ film is performed by way of RIE using a fluorine-based gas such as $CF_4$, etc. Thereafter, the resist is removed to form a pixel electrode 503.

Since $V_2N$ is excellent in corrosion resistance, it is also highly resistive to iodides. Further, since $V_2N$ is excellent in lattice alignment with a metal iodide, it is suited for use as a lower electrode of the X-ray-charge conversion film.

Then, by means of vapor deposition, a high resistance InI layer 230 is formed on the pixel electrode 503 to a thickness of about 50 μm. Then, by means of vapor deposition, a high resistance $SnI_2$ layer 240 is formed on the InI layer 230 to a thickness of about 100 μm to 1000 μm, more preferably 300 μm at a temperature of 150° C. Additionally, by means of vapor deposition, a high resistance $BiI_3$ layer 250 is formed on the $SnI_2$ layer 240 to a thickness of 50 μm.

Further, a layer of Cr having a thickness of 200 nm is formed, without the accompaniment of patterning step, on the surface of the $BiI_3$ layer 250 to form an upper electrode 212.

It is possible, in this manner, to realize the blocking effect of low dark current by forming a laminate of InI layer 230/$SnI_2$ layer 240/$BiI_3$ layer 250. Since the band gaps of these InI, $SnI_2$ and $BiI_3$ are 2.01 eV, 2.45 eV and 1.73 eV, respectively, these layers are enabled to constitute a band structure which is capable of effectively blocking the hole and the electron.

Moreover, since $SnI_2$ and $BiI_3$ can be assumed as being a hexagonal crystal structure as mentioned above and are enabled to take values which are very close to a=4.6 and c=7.0, it is possible to minimize the misalignment of lattice and to realize very excellent lattice alignment, thus making it possible to substantially obviate the generation of defects.

Figure 7:
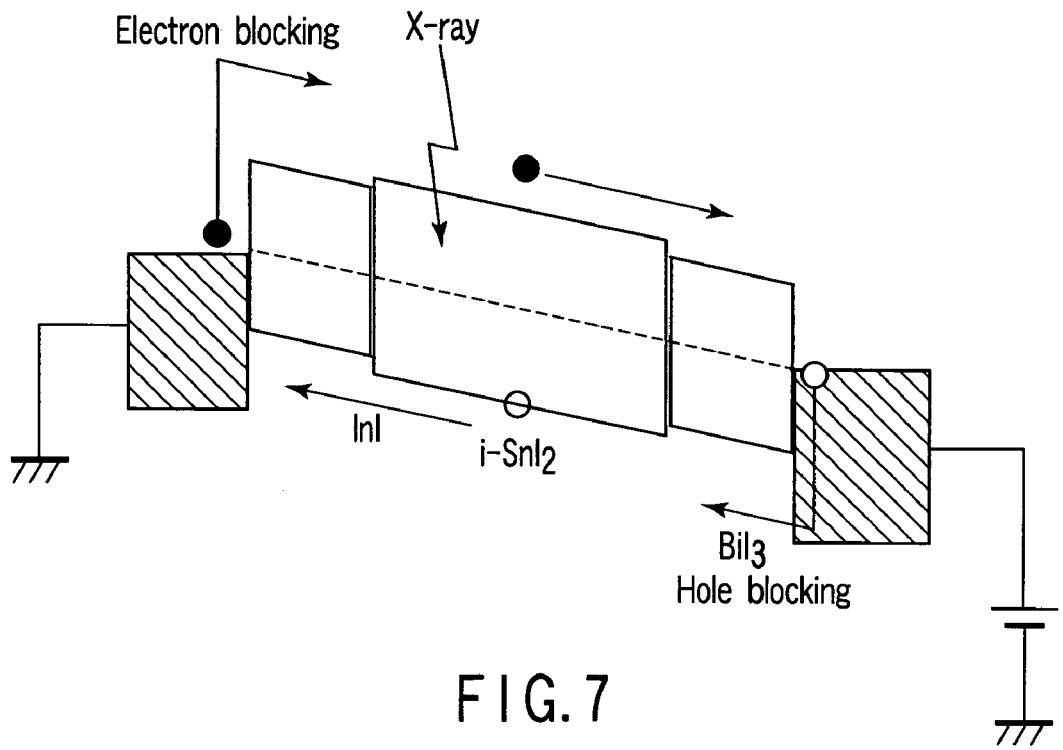
FIG. 7 is a diagram illustrating the band structure of the X-ray-charge conversion film of the flat panel X-ray detector according to a third embodiment of the present invention.

The band structure of a laminate of InI layer 230/$SnI_2$ layer 240/$BiI_3$ layer 250 as a X-ray-charge conversion film is shown in FIG. 7.

As seen from the band structure view shown in FIG. 7, electrons and holes generated in i-type $SnI_2$ layer due to excitation by X rays arrive at an anode and cathode without any barrier. On the other hand, the number of electrons and holes injected from the cathode and anode respectively, which can get over barriers formed by the InI layer and the $BiI_3$ layer, are smaller. As those electrons and holes, which get over the barriers, produce dark current, the dark current in the flat panel X-ray detector according to this embodiment is low. That is, the structure of the flat panel X-ray detector according to this embodiment is effective in lowering of the dark current.

Furthermore, as the portion of the $SnI_2$ layer near the InI layer is doped with p-type impurity, InI layer is doped with n-type impurity, the portion of the $SnI_2$ layer near the $BiI_3$ layer is doped with n-type impurity, and the $BiI_3$ layer is doped with p-type impurity, barriers becomes higher in the structure of the flat panel X-ray detector according to this embodiment Then, peripheral driving circuits are mounted on the substrate of the TFT array X-ray sensitive film substrate that has fabricated as described above to thereby accomplish the manufacture of a flat panel X-ray detector. When the detection of X-ray images was performed by making use of this flat panel X-ray detector, excellent effects were recognized, i.e. it was possible to minimize residual images and to improve the resolution of images as compared with the flat panel X-ray detector which was manufactured by forming, on the pixel electrodes thereof, an X-ray-charge conversion film where the lattice constants of the films are not aligned with one another. Furthermore, owing to excellent blocking effect of dark current, it was also recognized very excellent effects that the generation of dark current can be minimized and even faint signals can be detected. In this case, $InI_3$ can be used instead of InI, because these characteristics are similar.

Fourth Embodiment

Figure 4:
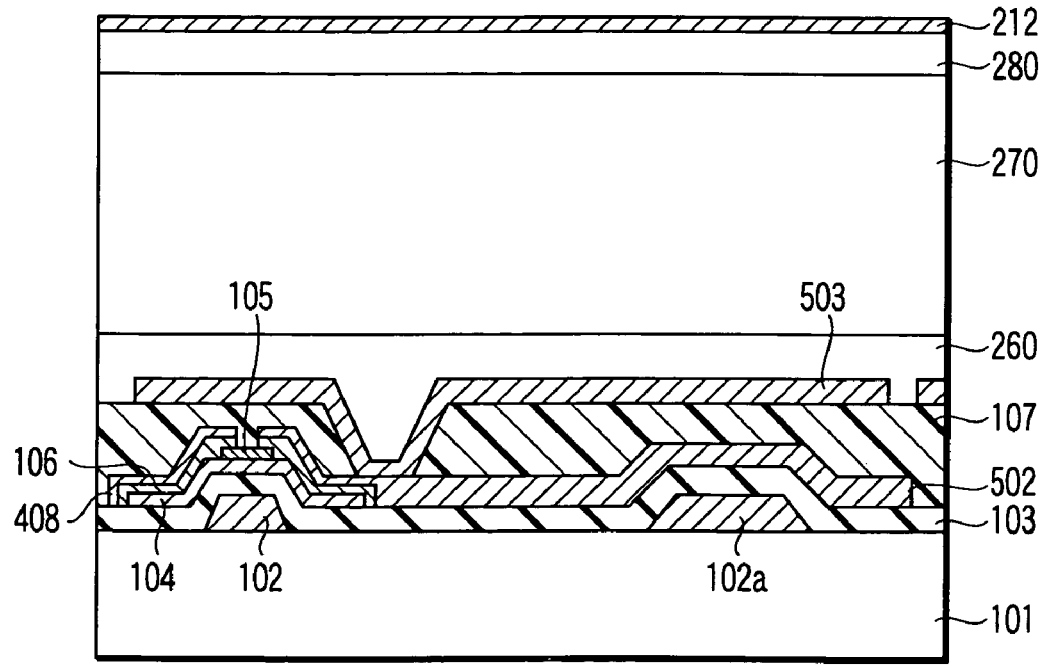
FIG. 4 is a cross-sectional view of the flat panel X-ray detector according to a fourth embodiment of the present invention.

Following are explanations of the fourth embodiment of the present invention. The cross-sectional view of the pixel of the flat panel X-ray detector according to this embodiment is shown in FIG. 4. Next, the manufacturing steps of the flat panel X-ray detector according to this embodiment will be explained with reference to FIG. 4.

First of all, a TFT array is fabricated on a glass substrate 101 in the same manner as described in the aforementioned first embodiment. Then, an ITO film is formed for the pixel electrode to a thickness of 1000 angstroms by means of sputtering method.

Then, a photoresist pattern is formed on this ITO film in conformity with the configuration of the pixel electrodes. Thereafter, by making use of this resist as a mask, the patterning of the ITO film is performed by way of wet etching. Thereafter, the resist is removed to form a pixel electrode 503.

Since ITO is excellent in corrosion resistance, it is also highly resistive to iodides. Also, ITO is usually employed for display electrodes for TFT-LCDs. It is useful to employ the same material and process of TFT-LCD production line for producing TFT arrays for flat panel detectors to decrease the cost for flat panel production.

Then, by means of vapor deposition, a high resistance $Sn_{0.5}In_{0.5}Br_2$ layer 260 is formed on the pixel electrode 503 to a thickness of about 50 μm. Since this $Sn_{0.5}In_{0.5}Br_2$ is of p-type, it is possible to further improve the aforementioned blocking effect. Then, a high resistance $SnBr_2$ layer 270 is formed on this $Sn_{0.5}In_{0.5}Br_2$ layer 260 to a thickness of about 100 μm to 1000 μm, more preferably 300 μm at a temperature of 200° C.

Then, by means of vapor deposition, a high resistance $Sn_{0.5}Bi_{0.5}Br_{0.5}$ layer 280 is formed on this $SnBr_2$ layer 270 to a thickness of 50 μm. Since this $Sn_{0.5}Bi_{0.5}Br_{0.5}$ is of n-type, it is possible to further improve the aforementioned blocking effect.

Further, a layer of Cr having a thickness of 200 nm is formed, without the accompaniment of patterning step, on the surface of this $Sn_{0.5}Bi_{0.5}Br_{0.5}$ layer 280 to form an upper electrode 212.

It is possible, in this manner, to realize the blocking effect of low dark current by forming a laminate of $Sn_{0.5}In_{0.5}Br_2$ layer 260/$SnBr_2$ layer 270/$Sn_{0.5}Bi_{0.5}Br_{0.5}$ layer 280. Since the band gap of the $SnBr_2$ is larger than that of $Sn_{0.5}Bi_{0.5}Br_{0.5}$ and $Sn_{0.5}In_{0.5}Br_2$, these layers are enabled to constitute a band structure which is capable of effectively blocking the hole and the electron.

Moreover, since these $Sn_{0.5}In_{0.5}Br_2$, $SnBr_2$ and $Sn_{0.5}Bi_{0.5}Br_{0.5}$ can be assumed as being a hexagonal crystal structure as mentioned above and are enabled to take values which are very close to a=3.9 and c=5.5, it is possible to minimize the misalignment of lattice and to realize very excellent lattice alignment, thus making it possible to substantially obviate the generation of defects.

Figure 8:
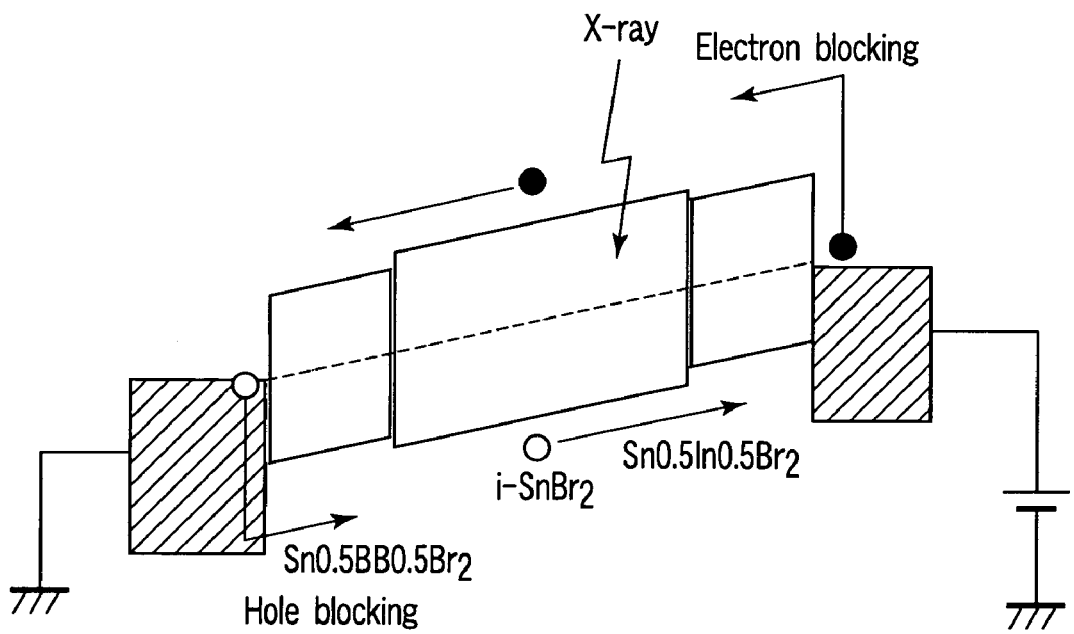
FIG. 8 is a diagram illustrating the band structure of the X-ray-charge conversion film of the flat panel X-ray detector according to a fourth embodiment of the present invention.

The band structure of a laminate of $Sn_{0.5}In_{0.5}Br_2$ layer 260/$SnBr_2$ layer 270/$Sn_{0.5}Bi_{0.5}Br_{0.5}$ layer 280 as a X-ray-charge conversion film is shown in FIG. 8.

As seen from the band structure view shown in FIG. 8, electrons and holes generated in the $SnBr_2$ layer due to excitation by X rays arrive at an anode and cathode, respectively, without any barrier. On the other hand, the number of electrons and holes injected from the cathode and anode, respectively, which can get over barriers formed by the $Sn_{0.5}In_{0.5}Br_2$ layer and the $Sn_{0.5}Bi_{0.5}Br_{0.5}$ layer, are decreased. As those electrons and holes from the electrodes, which get over the barriers, produce dark current, the dark current in the flat panel X-ray detector according to this embodiment is low. That is, the structure of the flat panel X-ray detector according to this embodiment is effective in lowering of the dark current.

Furthermore, as the portion of the $SnBr_2$ layer near the $Sn_{0.5}In_{0.5}Br_2$ layer is doped with p-type impurity, and the portion of the $SnBr_2$ layer near the $Sn_{0.5}Bi_{0.5}Br_{0.5}$ layer is doped with n-type impurity, barriers becomes higher in the structure of the flat panel X-ray detector according to this embodiment Then, peripheral driving circuits are mounted on the substrate of the TFT array X-ray-charge conversion film substrate that has fabricated as described above to thereby accomplish the manufacture of a flat panel X-ray detector. When the detection of X-ray images was performed by making use of this flat panel X-ray detector, excellent effects were recognized, i.e. it was possible to minimize residual images and to improve the resolution of images as compared with the flat panel X-ray detector which was manufactured by forming, on the pixel electrodes thereof, an X-ray-charge conversion film where the lattice constants of the films are not aligned with one another. Furthermore, owing to excellent blocking effect of dark current, it was also recognized very excellent effects that the generation of dark current can be minimized and even faint signals can be detected.

Incidentally, the aforementioned mixed crystal of halide is not confined to the composition of $Sn_{0.5}In_{0.5}Br_2$, but may be suitably selected from the composition of $Sn_xIn_{(1-x)}Br_2$ wherein x is suitably selected from the range of 0 to 100% so as to obtain desired blocking effects and the properties of the detector. This definition is also applicable to any of halides of I, Br and Cl.

The effects of using the same halogen (I, Br or Cl) in combination with different kinds of metals as shown in the third and fourth embodiments can be derived individually or independently without necessitating the employment of a substrate which is lattice-matched with the metal halides. The reason for this can be attributed to the fact that due to the effect of aligning with an underlying metal halide layer, the crystallinity of upper halide layer can be improved. For example, when the $Sn_{0.5}In_{0.5}Br_2$ layer 260 is vapor-deposited on the surface of a metal layer which is not aligned in lattice with the layer 260 and then, an $SnBr_2$ layer 270 and another $SnBr_2$ layer 270 are successively deposited, the crystallinity of the upper $SnBr_2$ layer 270 and $Sn_{0.5}In_{0.5}Br_{0.5}$ layer can be improved due to the excellentness of these upper layers in lattice alignment with the underlying metal halide layer.

The present invention is not limited to the case of using lattice matched underlayer electrode. The improvement of minimizing residual images, improvement of the resolution of images, and decrease in dark current can be obtained by laminating hexagonal lattice matched metal halide photoconductive layers. By using lattice matched metal halide film lamination, good junction between the photoconducting metal halide film and metal halide blocking layer and good quality photoconducting film can be obtained.

Various embodiments of the present invention have been explained above, the present invention is not confined to these embodiments. For example, as for the X-ray sensitive materials to be employed for forming the X-ray-charge conversion film, any kinds of metal halides can be employed. Incidentally, when the X-ray-charge conversion film is constituted by a plurality of layers, the halogen included in each of the layers should desirably be of the same kind. As long as the halogen included in these layers is the same in kind, the lattice constants of the metal halides can be made almost the same, and at the same time, can be adjusted to have a different band gap. As a result, it is now possible to realize a dark current-blocking effect in an excellent manner without substantially increasing defects of the metal halides.

In the foregoing embodiments, although a glass substrate is employed as a substrate for forming a TFT thereon, the substrate to be employed in the present invention is not confined to the glass substrate but may be of any kinds of material as long as the TFT can be formed thereon. For example, it is possible to employ a heat resistant plastic, in which case the resultant flat panel X-ray detector can be provided with plastic property as a whole.

In the foregoing embodiments, although a-Si is employed as a semiconductor for forming the TFT, it is also possible to employ polysilicon (p-Si), CdSe, etc. When the TFT is manufactured by making use of p-Si, it would become possible to miniaturize the TFT due to the high mobility of p-Si, thereby making it possible to enlarge the effective area of pixels and to form the peripheral circuits on the same surface of glass substrate, thus resulting in the reduction of manufacturing cost including the cost for the peripheral circuits.

As for the structure of the TFT, it may be either a top gate type or a back gate type.

With respect to the protective film 107 for covering the TFT, it is possible to employ inorganic materials such as SiNx or $SiO_2$ or organic materials such as polyimides ($\epsilon=$ about 3.3; pressure resistance: about 300 V/mm), benzocyclobutene ($\epsilon=$ about 2.7; pressure resistance: about 400 V/mm), acrylic photosensitive resin (HRC (trademark); JSR Co., Ltd.) ($\epsilon=$ about 3.2), black resist, etc. These materials may be laminated one another. Since fluorine-based resins are low in relative permittivity) ($\epsilon=$ about 2.1), fluorine-based resins can be also effectively employed as the protective film 107. This protective film 107 may not be photosensitive. However, when this protective film 107 is photosensitive, the patterning thereof can be easily performed and hence this protective film 107 should preferably be photosensitive.

As explained above, it is possible according to the present invention to provide a flat panel X-ray detector which is capable of minimizing residual images, improving the resolution of images, and decreasing in dark current as compared with the flat panel X-ray detector which is manufactured by forming, on the pixel electrodes thereof, an X-ray-charge conversion film where the lattice constants of the films are not aligned with one another. Furthermore, it is also possible to stabilize the properties of the X-ray-charge conversion film, thereby making it possible to improve the yield in the production of the X-ray-charge conversion film and to provide a high-performance flat panel X-ray detector which is excellent in efficiency and wide in dynamic range. Especially, when the X-ray-charge conversion film is constituted by a laminate structure comprising a plurality of layers differing in band gap one another, it would become possible to realize an excellent blocking effect against the generation of dark current, thus making it possible to provide a flat panel X-ray detector provided with such excellent properties that it is capable of extremely minimizing the generation of dark current and capable of detecting even a faint signal.

In the foregoing explanations, the X-ray-charge conversion film is formed of a laminate film consisting of a plurality of metal halide films differing in band gap and laminated along the c-axis of hexagonal crystal structure. However, the X-ray-charge conversion film is not necessarily a laminate film, and may be a mono-layer film provided that at least one of a pair of electrodes contacting with the mono-layer film is formed of a conductive film which is lattice-matched with the metal halide film. Namely, even if the X-ray-charge conversion film is constituted by a mono-layer film in such a manner as described above, the effects of the X-ray-charge conversion film to minimize the generation of dark current can be retained. Specific examples of the flat panel X-ray detector having an X-ray-charge conversion film of aforementioned constructions can be estimated from FIGS. 1 and 2, i.e. in the flat panel X-ray detector of the first embodiment which is shown in FIG. 1, the p-type $SnI_2$ layer 210a and the n-type $SnI_2$ layer 210b are both deleted therefrom; and in the flat panel X-ray detector of the second embodiment which is shown in FIG. 2, the p-type $PbI_2$ layer 220a and the n-type $PbI_2$ layer 220b are both deleted therefrom.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A flat panel X-ray detector which comprises:
   an X-ray-charge conversion film converting incident X-rays into electric charges; and
   a pair of electrodes disposed in contact with both surfaces of said X-ray-charge conversion film;
   wherein said X-ray-charge conversion film has a laminate structure including a plurality of metal halide films laminated along a direction of a c-axis of a hexagonal crystal structure and differing in band gap from one another, halogen atoms contained in said plurality of metal halide films are of the same kind among them, and said plurality of metal halide films have about the same lattice constant.

2. The fiat panel X-ray detector according to claim 1, wherein at least one of said pair of electrodes is a conductive film which is lattice-matched with said metal halide film disposed neighboring thereon.

3. The flat panel X-ray detector according to claim 1, wherein said metal halide film comprises at least one metal halide selected from the group consisting of metal iodide, metal bromide and metal chloride, said metal being selected from the group consisting of Pb, Sn, Bi, and Cd.

4. The flat panel X-ray detector according to claim 1, wherein said metal halide film comprises at least one metal halide selected from the group consisting of $PbI_2$, $SnI_2$, $BiI_3$, and $CdI_2$.

5. The flat panel X-ray detector according to claim 1, wherein said metal halide film comprises at least one metal halide selected from the group consisting of $PbI_2$, $SnI_2$, and $BiI_3$, said electrodes comprises a hexagonal crystal structure having a-axis lattice constant of 4.5 angstroms, a face-centered cubic structure having a-axis lattice constant of 6.45 angstroms or a body-centered cubic structure having a-axis lattice constant of 4.27 angstroms; and lattice mismatching between at least one of said electrodes and said metal halide film disposed neighboring thereon is 20% or less.

6. The flat panel X-ray detector according to claim 1, wherein said plurality of metal halide films comprise metal halides which are the same in kind with one another but differ in conductivity type from one another.

7. The flat panel X-ray detector according to claim 6, wherein said plurality of metal halide films comprise an n-type metal halide film and a p-type metal halide film.

8. The fiat panel X-ray detector according to claim 7, wherein said plurality of metal halide films comprise a Bi-doped n-type $PbI_2$ film and an In-doped p-type $PbI_2$ film.

9. The flat panel X-ray detector according to claim 6, wherein said plurality of metal halide films comprise an n-type metal halide film, an i-type metal halide film and a p-type metal halide film.

10. The flat panel X-ray detector according to claim 9, wherein said plurality of metal halide films comprise a Bi-doped n-type $PbI_2$ film, an undoped $PbI_2$ film and an In-doped p-type $PbI_2$ film.

11. The flat panel X-ray detector according to claim 1, wherein said plurality of metal halide films comprise mixed crystalline metal halides which are the same in kind with one another but additionally contain different kinds of metal elements therein.

12. The flat panel X-ray detector according to claim 11, wherein said plurality of metal halide films comprise a $Pb_xB_yI$ film, a $PbI_2$ film and a $Pb_x In_yI$ film.

13. The flat panel X-ray detector according to claim 1, wherein said plurality of metal halide films comprise various kinds of metal halides.

14. The flat panel X-ray detector according to claim 13, wherein said plurality of metal halide films comprise a $BiI_3$ film and a $PbI_2$ film.

15. The flat panel X-ray detector according to claim 1, wherein at least one of said electrodes comprise a hexagonal crystal structure having a-axis which is approximately equivalent to (001), a face-centered cubic structure having a-axis which is approximately equivalent to (111) or a body-centered cubic structure having a-axis which is approximately equivalent to (110).

16. A flat panel X-ray detector which comprises:
   an X-ray-charge conversion film converting incident X-rays into electric charge;
   pixel electrodes formed on said X-ray-charge conversion film to correspond with each of pixels which are arranged in a form of array;
   switching elements each electrically connected with each of said pixel electrodes;
   signal lines each electrically connected with said switching element of each row;
   scanning lines each electrically connected with said switching element of each column; and
   a common electrode which is disposed on one of the surfaces of said X-ray-charge conversion film, which is opposite to the surface where said pixel electrodes of said X-ray-charge conversion film are disposed;
   wherein said X-ray-charge conversion film has a laminate structure comprising a plurality of metal halide films laminated along a direction of a c-axis of a hexagonal crystal structure and differing in band gap from one another, the halogen atoms of the metal halide films are of the same kind with one another, and said plurality of metal halide films have about the same lattice constant.

17. The flat panel X-ray detector according to claim 16, wherein said plurality of metal halide films comprise a Bi-doped n-type $PbI_2$ film, an undoped $PbI_2$ film and an In-doped p-type $PbI_2$ film.

18. The flat panel X-ray detector according to claim 16, wherein said plurality of metal halide films comprise a $Pb_xB_yI$ film, a $PbI_2$ film and a $Pb_xIn_yI$ film.

19. The flat panel X-ray detector according to claim 16, wherein said plurality of metal halide films comprise a $BiI_3$ film and a $PbI_2$ film.

20. The flat panel X-ray detector according to claim 16, wherein at least one of said pair of electrodes is a conductive film which is lattice-matched with said metal halide film disposed neighboring thereon.

* * * * *